United States Patent [19]

Reichmanis et al.

[11] Patent Number: 4,481,049
[45] Date of Patent: Nov. 6, 1984

[54] BILEVEL RESIST

[75] Inventors: Elsa Reichmanis, Westfield; Gerald Smolinsky, Madison, both of N.J.

[73] Assignee: AT&T Bell Laboratories, Murray Hill, N.J.

[21] Appl. No.: 585,850

[22] Filed: Mar. 2, 1984

[51] Int. Cl.³ ...................... B44C 1/22; C03C 15/00; C03C 25/06

[52] U.S. Cl. .................................. 156/643; 156/646; 156/652; 156/655; 156/659.1; 156/668; 156/904; 204/192 E; 427/41; 427/43.1; 427/54.1; 430/312; 430/313

[58] Field of Search .............. 156/643, 646, 652, 655, 156/659.1, 661.1, 668, 904; 204/164, 192 E; 427/39, 41, 43.1, 54.1; 430/312, 313, 314–319, 329

[56] References Cited

U.S. PATENT DOCUMENTS 4,426,247  1/1984  Tamamura et al. ................ 156/643

Primary Examiner—William A. Powell
Attorney, Agent, or Firm—Bruce S. Schneider

[57] ABSTRACT

Excellent resolution in the lithographic fabrication of electronic devices is achieved with a specific bilevel resist. This bilevel resist includes an underlying layer formed with a conventional material such as a novolac resin baked at 200° C. for 30 minutes and an overlying layer including a silicon containing material such as a silicon derivative of poly(methyl methacrylate). This bilevel resist has the attributes of a trilevel resist and requires significantly less processing.

12 Claims, 1 Drawing Figure

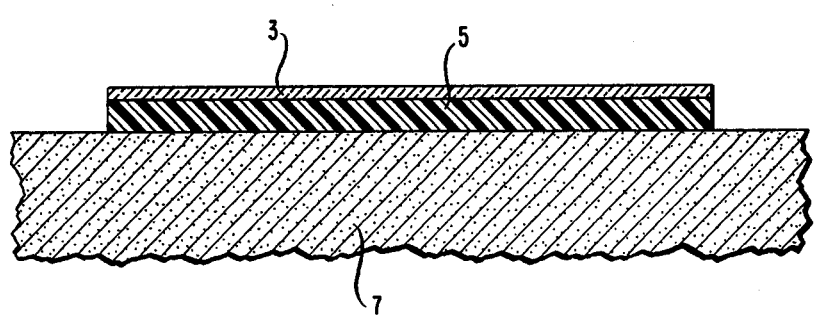

BILEVEL RESIST

BACKGROUND OF THE INVENTION

1. Field of the Invention

This invention relates to the fabrication of electronic devices and, in particular, to fabrication procedures utilizing lithographic techniques.

2. Art Background

Trilevel resists have been utilized in the formation of electronic devices and are especially suitable for the lithographic definition of small features, i.e., features smaller than 2 μm. These resists include an underlying layer generally deposited directly on the substrate being processed. (The substrate in this context is the semiconductor body including, if present, various levels of, for example, metallization, doped semiconductor material, and/or insulators.) Since the substrate typically does not have a planar surface, this layer is usually deposited with a thickness that is sufficient, despite the underlying irregularity, to present an essentially planar upper surface. An intermediary layer is then formed on this planarizing layer. The composition of the intermediary layer is chosen so that it is etched at least 5 times slower than the planarizing layer by a plasma that is capable of removing the underlying resist layer. A third layer (an overlying layer) that is delineable by exposure to radiation and by subsequent treatment with a suitable developing medium, is formed on the intermediary layer.

The trilevel resist is patterned by first delineating the overlying layer in the desired pattern. This pattern is then transferred to the intermediary layer through conventional techniques such as dry processing, e.g., reactive ion etching, causing an uncovering, in the desired pattern, of the underlying layer. The uncovered regions, generally of organic materials, are then removed with an oxygen plasma. Intermediary layers of materials such as silicon dioxide, that are essentially unaffected by an oxygen plasma, are employed to avoid its destruction during plasma processing and thus degradation of the transferred pattern.

Although the trilevel resist has proven to be an excellent expedient for producing fine features during semiconductor device fabrication, it does involve several discrete processing steps. Since there is always a desire to reduce processing steps and the associated costs, there has been a significant effort to develop a bilevel system yielding the advantages, i.e., planarization and high resolution, of a trilevel system. Attempts typically have been made to combine the attributes of the intermediary layer and the overlying layer into a single layer. To effect this combination, the resultant layer must be both delineable and also be at least 5 times more resistant than the underlying layer to the medium utilized to develop the underlying layer. Several materials have been reported as candidates, for use as this combined overlying material. For example, materials represented by the formulas

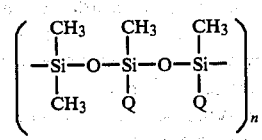

(Q is methyl, phenyl, and/or vinyl)

-continued

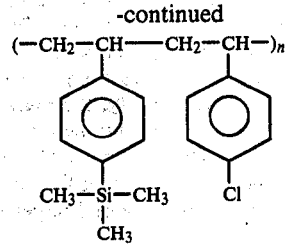

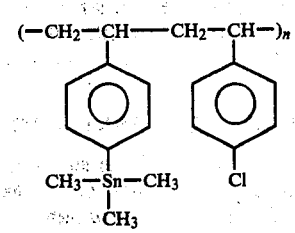

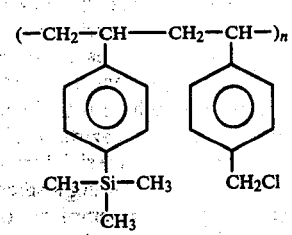

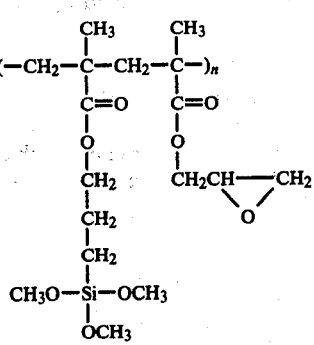

and

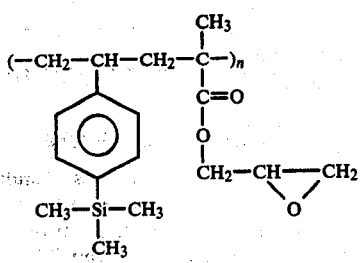

have been reported in the literature. (See *Regional Technical Conference*, "Photopolymers Principles-Processes and Materials," J. M. Shaw et al, Nov. 8, 1982, Ellenville, N.Y. (for compound 1), 1983 *International Symposium on Electron, Ion and Photon Beams*, S. A. MacDonald, May 31, 1983, Los Angeles, Calif. (for compounds 2 and 3), and *Journal of the Electrochemical Society*, 130, Suzuki et al, page 1962 (1983), for the remaining compounds.) Although these materials are resistant to an oxygen plasma, each is not entirely acceptable for other reasons. For example, all these materials are negative resists. Although negative resists are not inherently undesirable, most of the masks presently utilized for exposing resists and, in particular, trilevel resists, have been developed for positive resists. Thus, the use of a negative resist would require a complete change in the mask sets being utilized to produce semiconductor devices. Although this change is possible, it is costly and would not be desired. Additionally, the material represented by formula (1) either lacks dimensional stability and tends to creep during processing for thick films, or is highly defective when utilized in a thin layer. Thus, one of the purposes for utilizing a multilayer resist—increased resolution—is lost.

As a result, although there is a strong incentive to develop a bilevel resist having the attributes of a trilevel configuration, each proposal has, as yet, not been entirely satisfactory.

SUMMARY OF THE INVENTION

A bilevel resist that yields a planar surface, has excellent stability, undergoes a positive exposure to radiation, e.g., ultraviolet radiation, and which allows excellent resolution, e.g., resolution of 0.75 μm or finer, has been found. This bilevel resist includes a conventional underlying layer, e.g., a novolac based resist such as hard baked HPR-204 (a proprietary product of Philip A. Hunt Chemical Company which is basically a novolac resin with a naphthoquinone diazide sensitizer), and an overlying layer containing material formed by the polymerization of monomers including a silicon derivative of methyl methacrylate. Exemplary of suitable materials are compounds represented by the formula

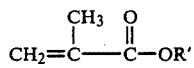

where R' is a silicon containing moiety such as a silicon alkyl represented by the formula

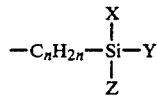

n being 1, 2, or 3 and X, Y, and Z being any combination of ethyl, methyl, or trimethylsiloxyl.

BRIEF DESCRIPTION OF THE DRAWING

The FIGURE is illustrative of structures involved in the invention.

DETAILED DESCRIPTION

As discussed, the inventive bilevel resist includes an underlying planarizing layer, 5, and an overlying layer, 3, that is delineable and that is resistant to the medium utilized to develop the underlying layer. The material utilized for the underlying layer is not critical and typically includes organic materials such as novolac and polyimide resins, e.g., (1) HPR-204 or AZ-1350 or AZ-1350J (proprietary products of Shipley Co., Inc., which are basically novolac resins with a substituted naphthoquinone diazide solution inhibitor) baked at 200° C. for 0.5 hours, and (2) polyimides such as Pyralin (i.e., proprietary material of E. I. duPont deNemours and Co., Inc.).

The underlying layer material, unlike a typical resist, need not undergo a chemical change upon exposure to radiation. It is only necessary that the material of the underlying resist layer be removable with an oxygen plasma and not appreciably dissolve in the solvent utilized to form the overlying layer. (See *VLSI Technology*, Chapter 8, edited by S. M. Sze, McGraw-Hill, New York, 1983 for a complete description of the removal of materials through plasma techniques.) Appreciable dissolution in this context means the intermixing of the overlying layer with the material from more than 500 Angstroms of the underlying layer. The thickness of the underlying layer depends on the size of the surface irregularities in the substrate. For typical structures utilized in the formation of semiconductor devices, layer thicknesses greater than 1 μm yield an essentially planar surface. However, thicknesses greater than 4 μm, although not precluded, are generally uneconomic and require excess processing time.

The thickness of the overlying layer depends on the desired resolution. Generally, the thicker the layer, the poorer the resolution. For resolutions less than 2 μm, layer thicknesses in the range 0.3 μm to 1.0 μm are generally utilized. Suitable layer thicknesses for either the underlying or overlying layers are easily obtained by conventional techniques such as by dissolving the material that is to form the layer in a solvent, e.g., cyclopentanone or 2-methoxyethyl acetate, and spin coating the final layer onto the substrate. (A full description of spin coating is found in *Photoresist Materials and Processes*, W. S. DeForrest, page 223, McGraw-Hill, New York, 1975.) The spinning speed utilized in the coating procedure determines the layer thickness and is controlled to yield the desired result.

The material of the overlying layer should include a polymer formed from monomers, including at least one compound represented by the formula

The R' group is specifically chosen so that it contains silicon. For compounds represented by formula (8), it is desirable that either 1, 2, or 3 methylene groups be interposed between the oxygen and silicon moiety in (8). For example, trimethylsilylmethyl, 2-(trimethylsilyl)ethyl, 3-(trimethylsilyl)propyl, trimethoxysilylmethyl, 2-(trimethoxysilyl)ethyl, 3-(trimethoxysilyl)propyl, 3-(pentamethyldisiloxy)propyl, 3-[bis(trimethylsiloxy)methylsilyl]propyl, and 3-[tris(trimethylsiloxy)silyl]propyl are exemplary of suitable R' groups. Other than this requirement for interposed methylene groups, the precise silicon containing moiety is not critical provided the glass transition temperature ($T_g$) of the resulting homopolymer or suitable copolymer formed from the monomer is higher than 50° C., preferably higher than 70° C. Typically the $T_g$ of the polymer is excessively low, i.e., lower than below 50° C., if extremely long carbon chains, i.e., chains having more than 3 carbons, are utilized, or if the substituents bound to the silicon have a chain length greater than that associated with ethyl, methyl, or methoxy groups.

Additionally, excessively large carbon containing R' moieties are not desirable since they significantly decrease the resistance of the material to oxygen containing plasmas. Generally, it is desirable to maintain the weight percentage of silicon in the polymer to more than 6 percent. For weight percentages lower than 6 percent, adequate oxygen resistance is not obtained.

It is possible to polymerize the materials of formula (8) to form homopolymers that are delineable with ultraviolet radiation and that are useful in the inventive bilevel resists. Although the use of these polymers is not precluded, they are typically relatively slowly exposed, i.e., require an exposure dose greater than 1 joule/cm$^2$, to produce images having dimensions of 2 μm or less. Thus, it is desirable but not essential to increase sensitivity, for example, to a level where relatively fast exposure, i.e., 0.5 joule/cm$^2$ or less, is possible. This increase is accomplished in one embodiment by copolymerizing the materials of formula (8) with a monomer that undergoes a chemical reaction when subjected to the radiation to be utilized for exposure of the overlying layer. For example, monomers such as oximes represented by the formula

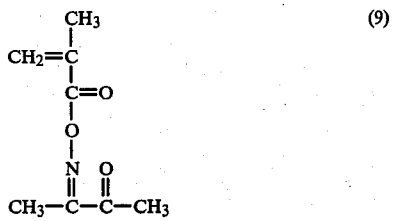
(9)

are copolymerized with the monomers of formula (8) to produce a material that is significantly more sensitive to ultraviolet light, e.g., light in the wavelength range 200 nm to 320 nm. The particular radiation-sensitive monomer copolymerized with the silicon containing monomer is not critical, and other moieties such as

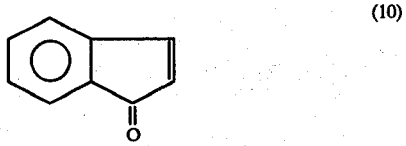
(10)

are employable. The relative ratio of the silicon containing monomer to the radiation-sensitive enhancing monomer should be limited so that the weight percentage of silicon in the final polymer material remains greater than 6 percent.

It is also possible to utilize silicon monomers whose homopolymers have a $T_g$ less than 50° C., provided they are copolymerized with a second monomer which increases the $T_g$ of the final polymer above 50° C. For example, homopolymers of monomers such as those represented by the formulas

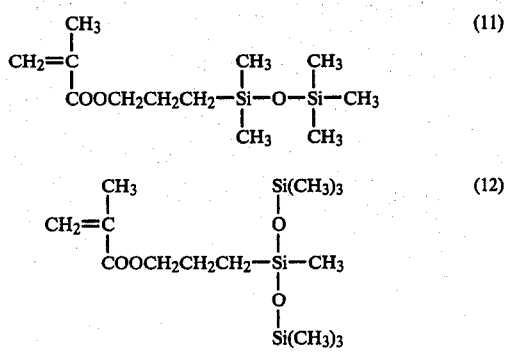

and

-continued

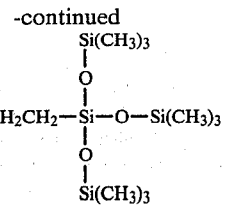
(13)

have a $T_g$ less than 50° C. When these monomers are copolymerized with appropriate levels of monomers such as methyl methacrylate and/or methacrylic acid, the final polymers have a $T_g$ significantly greater than 50° C. and are employable. A control sample is easily utilized to determine a monomer level which yields a suitable $T_g$.

Polymerization of all the previously discussed monomers is done by conventional techniques such as free radical polymerization, which is extensively discussed in a variety of texts, such as *Macromolecules, An Introduction to Polymer Science*, Chapter 2, edited by F. A. Bovey and F. H. Winslow, Academic Press, New York, 1979. Briefly, this procedure involves (1) combining the monomer(s) with a solvent (e.g., toluene or tetrahydrofuran) and a polymerization initiator such as benzoyl peroxide or t-butylhydroperoxide and (2) heating the entire mixture to a temperature typically in the range 40° C. to 110° C. The ratio of the silicon containing compound to the sensitivity enhancing monomer (if any) should be controlled to maintain the silicon content in the final polymer at greater than 6 weight percent. Additionally, the monomer ratio should be controlled so that it is possible to develop the overlying layer without substantially affecting the underlying layer. Generally, for sensitivity enhancing monomers such as oximes, mole ratios of silicon containing monomers to sensitivity enhancing monomers of 80:20 to 40:60 are suitable. For ratios above 80:20, the solubility characteristics change sufficiently so that it is difficult to obtain a solubility differential between the exposed and unexposed regions of the overlying layer. For ratios below 40:60, inadequate oxygen plasma resistance results from an insufficient level of silicon. (The ratios given are mole ratios for the final polymer. A control sample is easily utilized to determine the precise monomer mole ratio required to yield a desired mole ratio in the polymer.) The molecular weight of the resulting polymer also influences lithographic behavior. Typically, molecular weights in the range 30,000 to 1,000,000 are desirable. Molecular weights greater than 1,000,000 are difficult to achieve and result in extremely viscous polymer solutions, while molecular weights lower than 30,000 result in a poor differential solubility between the exposed and unexposed regions of the overlying layer.

To process the inventive bilevel resists, the overlying layer is exposed with suitable radiation, such as ultraviolet radiation. In the case of oxime or indanone containing polymers, radiation in the wavelength range 200 nm to 320 nm is generally utilized. Typically, incident exposure doses in the range 0.1 joule/cm$^2$ to 1 joule/cm$^2$ are employed. The specific exposure dose employed should be sufficient to cause a chemical reaction from the surface of the region that is subjected to radiation, through the volume underlying the exposed surface region, to the underlying resist material. Thus, the exposure should be sufficient so that upon development, the underlying resist material in the exposed regions is uncovered.

Development is accomplished through the use of solvents such as hexane, cyclohexane, methylisobutyl ketone, or a mixture of these compounds. Typically, the solvent should remove the exposed region of the overlying layer without removing more than 25 volume percent of the unexposed regions of the overlying layer. After the overlying layer is developed, its pattern is transferred to the underlying layer. This pattern transfer is accomplished by subjecting the substrate to an oxygen plasma. This oxygen plasma technique has been extensively described in *Introduction to Microlithography*, Chapter 6, edited by L. F. Thompson, C. G. Willson, and M. J. Bowden, American Chemical Society, Symposium Series 219, Washington D.C., 1983. Typically, power densities in the range 0.0015 watts/cm$^3$ to 0.15 watts/cm$^3$ are utilized to maintain the plasma so that removal rates for the underlying layer in the range 0.15 $\mu$m/minute to 0.3 $\mu$m/minute are achieved. (Under these conditions, the overlying layer is etched at 0.003 $\mu$m/minute to 0.03 $\mu$m/minute.) Generally, the plasma is struck in a gas containing oxygen. Total gas pressures in the range 0.01 Torr to 0.2 Torr are generally employed.

After the pattern has been transferred to the underlying layer, the delineated bilevel resist is utilized for processing steps such as metallization, dopant diffusion, or etching for the substrate, 7 in the FIGURE. The resist is then removed, and the processing of the substrate is completed to form the desired electronic devices.

The following examples are illustrative of the invention.

EXAMPLE 1

Purification of Materials

Methyl methacrylate, as purchased from the Aldrich Chemical Company, was placed in a round-bottom flask and distilled at a pressure of approximately 20 Torr utilizing a short-path distillation column. The collected distillate was then utilized in subsequent polymerization.

Methacrylic acid was also purchased from the Aldrich Chemical Company and purified utilizing suction filtration by employing approximately 10 grams of alumina as a filtering medium for each 50 grams of methacrylic acid filtered.

3-Methacryloxypropylpentamethyldisiloxane, 3-methacryloxypropylbis(trimethylsiloxy)methylsilane, and 3-methacryloxypropyltris(trimethylsiloxy)silane were each purchased from Petrarch Systems Inc. Each compound was washed twice with a 100 cc aliquot of distilled water for each 50 ml of sample. The samples were dried for 1 hour with magnesium sulfate and then filtered as described for methacrylic acid.

Trimethylsilylmethyl methacrylate was purchased from Petrarch Systems Inc. and purified by first dissolving 2 parts by volume of the sample in 1 part by volume of ether. The solution was washed 3 times with dilute aqueous sodium bicarbonate utilizing 1 aliquot of the sodium bicarbonate solution for each 3 aliquots of the methacrylate solution. The solution was then washed 3 times with 1 volume of distilled water for each 3 volumes of sample. The resulting washed solution was dried over anhydrous magnesium sulfate. The solution was then filtered and concentrated in the presence of copper screening at reduced pressure. The filtrate still contacting the copper screening was distilled at a pressure of approximately 20 Torr and a temperature of approximately 60° C. through a short distillation column packed with copper screening. The distillate was then employed in subsequent procedures.

The monomer, 3-oximino-2-butanone methacrylate, was prepared as described in U.S. Pat. No. 4,382,120, issued May 3, 1983, which is hereby incorporated by reference.

EXAMPLE 2

Preparation of Polymers

A. Poly(3-methacryloxypropylpentamethyldisiloxane-co-methacrylic acid)

Approximately 68 grams of 3-methacryloxypropylpentamethyldisiloxane was dissolved together with 20 grams of methacrylic acid in 300 ml of ethyl acetate. The solution was heated at reflux temperature for approximately 1 hour in an argon atmosphere, and then approximately 20 mg of benzoyl peroxide was added. Heating was continued for approximately 4 hours. The solution was cooled to room temperature, and precipitation was induced by introducing the solution into approximately 1,500 ml of hexane. The resulting precipitate was collected and redissolved in approximately 200 ml of ethyl acetate. The resulting solution was then introduced into approximately 1,500 ml of hexane to reprecipitate the polymer. The polymer was collected and subsequently air dried.

B. Terpolymers

Eight different terpolymers were prepared by initially dissolving approximately 90 total grams of the monomer into approximately 300 ml of tetrahydrofuran. The ratio of each monomer in the total 90 grams is shown in Table I for each prepared terpolymer. The polymerization procedure was the same as described for the reaction of 3-methacryloxypropylpentamethyldisiloxane and methacrylic acid. The initiator employed was approximately 5 ml of 70 percent by volume t-butylhydroperoxide in water.

C. Poly(trimethylsilylmethyl methacrylate)

The procedure described for the polymerization of 3-methacryloxypropylpentamethyldisiloxane and methacrylic acid was followed, except approximately 43 grams of trimethylsilylmethyl methacrylate was dissolved in approximately 120 ml of toluene.

D. Poly(trimethylsilylmethyl methacrylate-co-3-oximino-2-butanone methacrylate)

Three oxime containing copolymers were prepared by initially dissolving approximately 80 grams of the combined monomers in about 200 ml of ethyl acetate and then following the procedure for the polymerization of 3-methacryloxypropylpentamethyldisiloxane with methacrylic acid. The ratio of each monomer in the combined 80 grams for each preparation is shown in Table II.

EXAMPLE 3

Preparation of Bilevel Resists

A plurality of 3-inch in diameter silicon substrates was coated with a standard novolac resist by introducing about 3 ml of HPR-204 onto each substrate and then spinning it at about 3,000 rpm. Each substrate was then baked in air at approximately 250° C. for 1 hour. A solution of the silicon containing polymer was prepared by dissolving 15 weight percent of the polymer in cyclopentanone. Each solution was filtered through a 0.5 μm membrane filter. Approximately a 3 ml aliquot of each silicon-polymer solution was placed on its own novolac coated substrate and spun at about 3,000 rpm. Each substrate was then baked in air at 160° C. for 1 hour.

EXAMPLE 6

Measurement of Etching Rate

The samples shown in Table V were deposited, as described in Example 3, on a silicon substrate which did not have an HPR layer. These samples were then etched, as described in Example 5, to determine their etching rate and thus to determine their suitability as the upper layer in a bilevel resist. The etching rates are also shown in Table V.

TABLE I

| Polymer[a] | Monomer Ratio | Final % Silicon[b] | Mol. Wt. Mw × 10$^{-5}$ | Mw/Mn | Tg |
|---|---|---|---|---|---|
| P(DS—A—M) | 1.0:7.6:17.0 | 1.8 | 2.82 | 2.39 | 144° C. |
| P(DS—A—M) | 1.0:3.5:7.1 | 4.3 | 2.70 | 1.99 | 134° C. |
| P(DS—A—M) | 1.0:2.5:3.8 | 5.9 | 2.04 | 2.86 | 130° C. |
| P(DS—A—M) | 1.0:1.9:2.2 | 7.9 | 2.65 | 1.87 | 122° C. |
| P(DS—A—M) | 1.0:1.4:1.0 | 10.9 | 2.50 | 1.88 | 107° C. |
| P(DS—A) | 2.0:1.0 | 17.5 | 3.57 | 1.83 | (110° C. ± 20° C.) |
| P(TS—A—M) | 1.0:2.2:1.7 | 10.8 | 2.54 | 2.10 | 138° C. |
| P(QS—A—M) | 1.0:2.3:1.7 | 12.3 | 2.98 | 2.12 | 140° C. |

[a]DS refers to 3-methacryloxypropylpentamethyldisiloxane.
A refers to methacrylic acid.
M refers to methyl methacrylate.
TS refers to 3-methacryloxypropylbis(trimethylsiloxy)-methylsilane.
QS refers to 3-methacryloxypropyltris(trimethylsiloxy)silane.
[b]As determined by elemental analysis.

EXAMPLE 4

Exposure and Development—Measurement of Exposure Sensitivity

Each resist coated sample was exposed through a contact mask. The mask utilized was a quartz multidensity resolution target (Model B purchased from the Opto-Line Corporation). The exposure was done utilizing a light source from a Model 29DH system purchased from Optical Associates Inc., which was optimized for use at approximately 260 nm. The output of the light source was approximately 10 milliwatts/cm$^2$ at the mask surface. The sensitivity, as defined by the time necessary to produce complete removal of the resist in the irradiated area upon development, is shown for each resist in Table III. For this purpose, the developers also shown in Table III were employed, and each developer was chosen to limit the amount of the unexposed region removed during the purposeful removal of the exposed region.

EXAMPLE 5

Exposure and Development—Measurement of Resolution

The same development procedure as described in Example 4 was followed on separate resist coated silicon substrates, except the mask had openings of progressively larger widths (0.75 μm to 10 μm widths). The exposed samples were developed as described in Example 4. Each substrate was then placed on the sample holder of a reactive ion etcher. The chamber was evacuated, and a 15 sccm flow of oxygen was introduced to produce a partial pressure of either 0.02 Torr or 0.1 Torr in the chamber. An rf power density of 0.0035 watts/cm$^3$ with a negative bias of 200 volts was utilized. The plasma was extinguished after 10 minutes. The resolution achieved for each sample at either 0.02 Torr or 0.1 Torr is shown in Table IV.

TABLE II

| | Mole Ratio | | Final % Sili-con[a] | Mol. Wt. Mw × 10$^{-5}$ | Mw/Mn | Tg |
|---|---|---|---|---|---|---|
| Polymer[b] | Before Polym. | Final Polym. | | | | |
| P(SiMA) | — | — | 14.82 | 2.02 | 1.78 | 108° C. |
| P(Si—OM) | 92.5:7.5 | 90:10 | 14.33 | 1.49 | 2.36 | 85° C. |
| P(Si—OM) | 85:15 | 77:23 | 10.80 | 1.01 | 2.23 | 80° C. |
| P(Si—OM) | 75:25 | 62:38 | 9.61 | 1.25 | 3.46 | 91° C. |

[a]As determined by elemental analysis.
[b]P(SiMA) refers to poly(trimethylsilylmethyl methacrylate).
Si refers to trimethylsilylmethyl methacrylate.
OM refers to 3-oximino-2-butanone methacrylate.

TABLE III

Polymer Lithographic Characteristics

| Polymer[a] | Final Mole Ratio | Developer[b] | Sensitivity[c] (J/cm$^2$) | Contrast |
|---|---|---|---|---|
| PMMA[g] | — | MIBK[d] | ~3.6 | ~2 |
| P(DS—A—M) | 1.0:7.6:17 | MIBK | 3.6 | 3.2 |
| P(DS—A—M) | 1.0:3.5:7.1 | MIBK | 2.4 | 3.8 |
| P(DS—A—M) | 1.0:2.5:3.8 | MIBK | 1.8 | 2.8 |
| P(DS—A—M) | 1.0:1.9:2.2 | MIBK-Toluene (1:1) | 0.5 | 3.8 |
| P(DS—A—M) | 1.0:1.4:1.0 | MIBK-Toluene (3:5) | 0.5 | 4.7 |
| P(DS—A) | 2.0:1.0 | MIBK | 1.1 | 3.6 |
| P(TS—A—M) | 1.0:2.2:1.7 | MIBK-Toluene (1:1) | 0.7 | 4.7 |
| P(QS—A—M) | 1.0:2.3:1.7 | MIBK-Toluene (1:1) | 1.3 | 4.3 |
| P(SiMA) | — | $C_6H_{12}$[e]—MIBK (5:2) | 1.05 | 2.1 |
| P(Si—OM) | 77:23 | $C_6H_{14}$[f] | 0.13 | 1.5-2 |
| P(Si—OM) | 62:38 | $C_6H_{12}$ | 0.14 | 2.2 |

[a]See previous tables for abbreviations.
[b]For a time period of 60 sec.
[c]Determined as the exposure required to clear an area of 1 cm$^2$.
[d]Methylisobutyl ketone.
[e]Cyclohexane.
[f]Hexane.
[g]Poly(methyl methacrylate).

TABLE IV

| Polymer[a] | Final Mole Ratio | Sensitivity (J/cm$^2$) | Resolution |
| --- | --- | --- | --- |
| P(DS—A—M) | 1.0:2.5:3.8 | 2.3 | 0.75 μm |
| P(SiMA) | — | 1.5 | 0.75 μm |
| P(Si—OM) | 77:23 | 0.30 | 0.75 μm |
| P(Si—OM) | 62:38 | 0.25 | 0.75 μm |

[a] See previous tables for abbreviations.

TABLE V

| Polymer[a] | Final Mole Ratio | RIE Rate (Å/min) at O$_2$ Pressures of 20 μm | RIE Rate (Å/min) at O$_2$ Pressures of 100 μm |
| --- | --- | --- | --- |
| PMMA | — | 3700 | — |
| HPR-204 | — | 1750 | 3250 |
| P(SiMA) | — | 160 | 80 |
| P(Si—OM) | 90:10 | 70 | <50 |
| P(Si—OM) | 77:23 | 125 | 70 |
| P(Si—OM) | 62:38 | 150 | 70 |
| P(DS—A—M) | 1:7.6:17 | 1750 | — |
| P(DS—A—M) | 1:3.5:7.1 | 1488 | — |
| P(DS—A—M) | 1:2.5:3.8 | 275 | — |
| P(DS—A—M) | 1:1.9:2.2 | 246 | — |
| P(DS—A—M) | 1:1.4:1.0 | 212 | — |
| P(TS—A—M) | 1:2.2:1.7 | 207 | — |
| P(QS—A—M) | 1:2.3:1.7 | 202 | — |
| P(DS—A) | 2:1 | 112 | — |

[a] See previous tables for abbreviations

What is claimed is:

1. A process for fabricating a device comprising the steps of
   forming a radiation sensitive region, on a substrate, patterning at least a portion of said region, and
   further processing said substrate characterized in that said region comprises a composition formed by a polymerization process employing a material represented by the formula

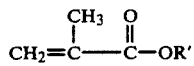

where R' contains silicon and is chosen so that the $T_g$ of said composition is higher than 50° C., and the silicon weight percentage of said composition is at least 6 percent.

2. The process of claim 1 wherein R is represented by the formula

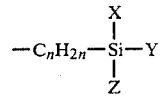

where X, Y, and Z are chosen so that the $T_g$ of said composition is higher than 50° C., and the silicon weight percentage of said composition is at least 6 percent.

3. The process of claim 2 wherein said R is chosen from the group consisting of trimethylsilylmethyl, 2-(trimethylsilyl)ethyl, 3-(trimethylsilyl)propyl, trimethoxysilylmethyl, 2-(trimethoxysilyl)ethyl, 3-(trimethoxysilyl)propyl, 3-(pentamethyldisiloxy)propyl, 3-[bis(trimethylsiloxy)methylsilyl]propyl, and 3-[tris(trimethylsiloxy)silyl]propyl.

4. The process of claim 1 wherein said composition is formed by a polymerization process employing said material and a monomer chosen from the group consisting of oxime and indanone compounds.

5. The process of claim 2 wherein said composition is formed by a polymerization process employing said material and a monomer chosen from the group consisting of oxime and indanone compounds.

6. The process of claim 1 wherein a region capable of selective removal is interposed between said radiation sensitive region and said substrate.

7. The process of claim 6 wherein said R is chosen from the group consisting of trimethylsilylmethyl, 2-(trimethylsilyl)ethyl, 3-(trimethylsilyl)propyl, trimethoxysilylmethyl, 2-(trimethoxysilyl)ethyl, 3-(trimethoxysilyl)propyl, 3-(pentamethyldisiloxy)propyl, 3-[bis(trimethylsiloxy)methylsilyl]propyl, and 3-[tris(trimethylsiloxy)silyl]propyl.

8. The process of claim 7 wherein said composition is formed by a polymerization process employing said material and a monomer chosen from the group consisting of oxime and indanone compounds.

9. The process of claim 6 wherein said composition is formed by a polymerization process employing said material and a monomer chosen from the group consisting of oxime and indanone compounds.

10. The process of claim 6 wherein said patterning comprises the step of subjecting said region to said radiation and then subjecting said region to a plasma discharge.

11. The process of claim 10 wherein said region capable of selective removal undergoes said removal by being subjected to a solvent.

12. The process of claim 10 wherein said plasma discharge comprises an oxygen plasma discharge.

* * * * *

UNITED STATES PATENT AND TRADEMARK OFFICE
CERTIFICATE OF CORRECTION

PATENT NO. : 4,481,049

DATED : November 6, 1984

INVENTOR(S) : Elsa Reichmanis and Gerald Smolinsky

It is certified that error appears in the above-identified patent and that said Letters Patent is hereby corrected as shown below:

Column 10, lines 34 and 35, "Before Polym. Polym."

should read --Before After Polym. Polym.--.

Signed and Sealed this

Twenty-fourth Day of September 1985

[SEAL]

Attest:

DONALD J. QUIGG

Attesting Officer

Commissioner of Patents and Trademarks—Designate